United States Patent
Funk

(10) Patent No.: US 7,859,093 B2
(45) Date of Patent: *Dec. 28, 2010

(54) METHOD FOR PROTECTING ENCAPSULATED SENSOR STRUCTURES USING STACK PACKAGING

(75) Inventor: Karsten Funk, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 392 days.

This patent is subject to a terminal disclaimer.

(21) Appl. No.: 11/903,490

(22) Filed: Sep. 21, 2007

(65) Prior Publication Data

US 2008/0237826 A1 Oct. 2, 2008

Related U.S. Application Data

(63) Continuation of application No. 10/404,567, filed on Mar. 31, 2003, now Pat. No. 7,335,971.

(51) Int. Cl.
H01L 23/02 (2006.01)

(52) U.S. Cl. .................... 257/686; 257/414; 257/417; 257/419; 257/704; 257/710; 257/774; 257/778

(58) Field of Classification Search .......... None
See application file for complete search history.

(56) References Cited

U.S. PATENT DOCUMENTS

| | | | |
|---|---|---|---|
| 5,811,799 A | 9/1998 | Wu | |
| 6,140,144 A | 10/2000 | Najafi et al. | |
| 6,323,550 B1 | 11/2001 | Martin et al. | |
| 6,432,737 B1 | 8/2002 | Webster | |
| 2004/0007750 A1* | 1/2004 | Anderson et al. | 257/414 |
| 2004/0266048 A1 | 12/2004 | Platt et al. | |
| 2005/0253240 A1* | 11/2005 | Nuechter et al. | 257/686 |

FOREIGN PATENT DOCUMENTS

| | | |
|---|---|---|
| DE | 100 17 422 | 4/2000 |
| DE | 100 17 976 | 4/2000 |

OTHER PUBLICATIONS

Morrison, David G., "Die and Package Stacking Grow Up, 3-D Package Options Proliferate as Advances in Wafer Thinning and Handling, Wirebonding and Materials Squeeze More Silicon Into Smaller Footprints," Electronic Design, Jun. 24, 3003, 3 pages.

\* cited by examiner

*Primary Examiner*—N Drew Richards
*Assistant Examiner*—Kyoung Lee
(74) *Attorney, Agent, or Firm*—Kenyon & Kenyon LLP

(57) ABSTRACT

A method of protecting a micro-mechanical sensor structure embedded in a micro-mechanical sensor chip, in which the micro-mechanical sensor structure is fabricated with a protective membrane, the micro-mechanical sensor chip is arranged so that a surface of the protective membrane faces toward a second chip, and the micro-mechanical sensor chip is secured to the second chip.

40 Claims, 18 Drawing Sheets

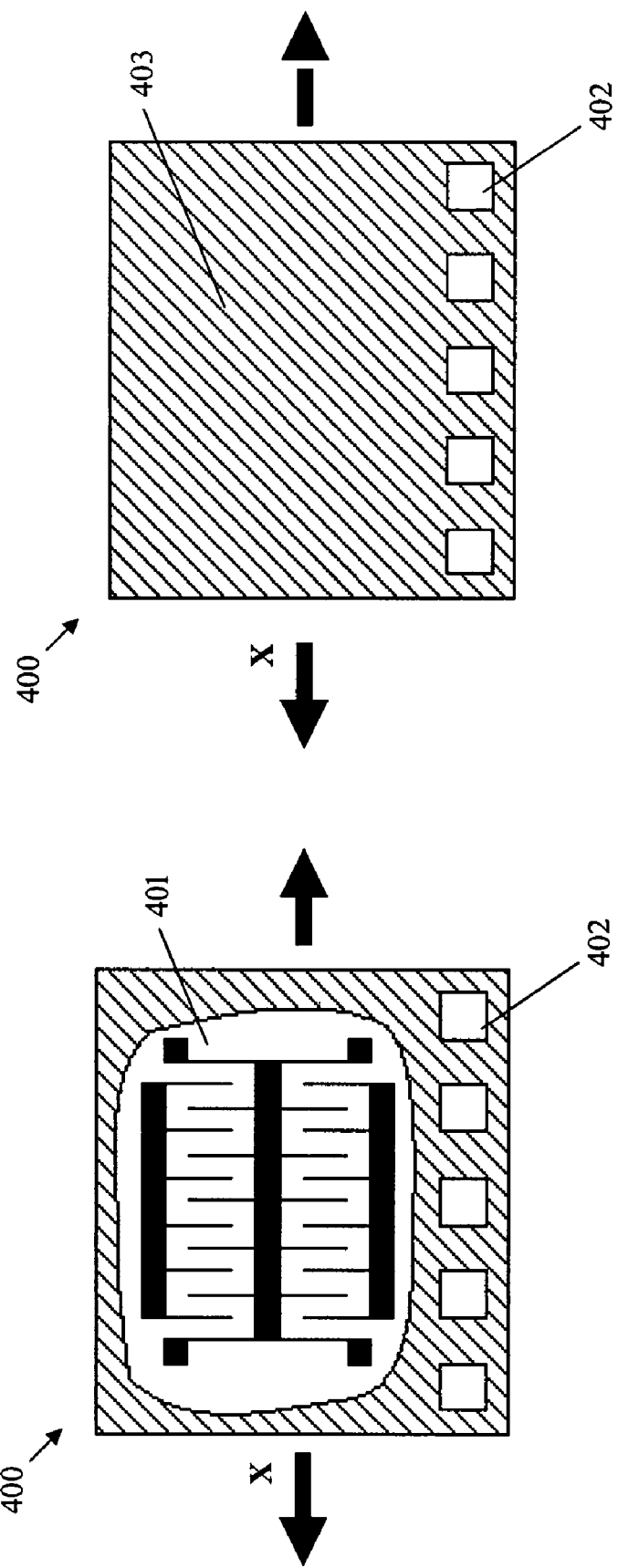

METHOD FOR PROTECTING ENCAPSULATED SENSOR STRUCTURES USING STACK PACKAGING

CROSS-REFERENCE TO RELATED APPLICATIONS

This application is a Continuation Application of and claims priority to U.S. patent application Ser. No. 10/404,567, filed on Mar. 31, 2003, now U.S. Pat. No. 7,335,971, which is incorporated herein by reference in its entirety.

FIELD OF THE INVENTION

The present invention relates to a method for protecting encapsulated micro-mechanical sensor structures.

BACKGROUND INFORMATION

Micro-mechanical sensor structures may be fragile and may be easily damaged and/or destroyed if they come in contact with foreign particles and/or liquids (including, for example, dirt and condensed humidity). Therefore, it may be desired to protect such structures early in the production process.

Micro-mechanical sensor structures may be protected by applying an additional film of membrane layer during the production process to encapsulate the sensor structure and to shield its sensitive areas from undesired external contaminants, such as, for example, dust and dirt, or potentially harmful environmental conditions, such as, for example heat and humidity. The protective membrane layer, however, may be too thin to withstand the high pressures that may occur during the plastic molding of the micro-mechanical sensor structure device. Although enhancing the thickness of the protective membrane layer may provide greater mechanical stability, such an enhancement may be costly and may not always be feasible, especially if the overall package thickness of the sensor structure device is limited by design constraints.

Micro-mechanical sensor structures may also be protected by stacking several sensor chips or wafers on top of each other within the package. For example, a sensor wafer with etched holes and grooves may be bonded on top of an another sensor wafer to provide reinforcement. In such a configuration, the grooves may be arranged to provide access directly above the sensor structure and the holes may be aligned to provide openings for the contacts. The process of stacking several sensor wafers, however, may increase the material cost (e.g., two wafers may be required instead of only one) and the resulting multi-wafer sensor device may be undesirably thick.

SUMMARY OF THE INVENTION

An exemplary embodiment and/or exemplary method of the present invention for protecting a micro-mechanical sensor structure may arrange the micro-mechanical sensor structure "face-down" onto a complementary electronic integrated circuit chip so that the thin membrane encapsulating the sensor structure is completely covered. By doing so, the chip carrying the electronic circuitry may take over an additional mechanical task of supporting the thin membrane which would otherwise be too weak to withstand the pressures exerted on it during fabrication.

It is believed that the exemplary embodiment and/or exemplary method may provide a higher stability for the micro-mechanical sensor structure at reduced cost. In particular, the exemplary embodiment and/or exemplary method may permit the encapsulated mechanical sensor structure to withstand the high molding pressures that may be encountered during fabrication, while at the same time reducing the overall package size and/or a required number of bond wires.

According to another exemplary embodiment and/or exemplary method, an electronic integrated circuit chip may be flipped onto a "face-up" micro-mechanical sensor chip whose thin film covering an embedded micro-mechanical sensor structure faces the electronic integrated circuit chip.

According to another exemplary embodiment and/or exemplary method, several micro-mechanical sensor chips with thin protective membranes covering their micro-mechanical sensor structures may be stacked upon, underneath, or in conjunction with one or more electronic integrated circuit chips to provide a variety of combined micro-mechanical sensor/electronic integrated circuit chip configurations for a wide variety of micro-mechanical sensor applications. For example, such a multi-layer arrangement of micro-mechanical sensor chips with electronic integrated circuit chips may be used to create a multi-dimensional micro-mechanical accelerometer, gyroscope, or other sensory device by stacking multiple micro-mechanical sensor chips having thin protective membranes onto, underneath, or in conjunction with one or more electronic integrated circuit or other types of micro-chips.

In a further exemplary embodiment and/or exemplary method, the thin protective membrane may be eliminated. In this case, a sealing bond ring arranged to surround the micro-mechanical sensor structure may protect the micro-mechanical element once the electronic integrated circuit chip is bonded to the sensor chip.

An exemplary method of protecting a micro-mechanical sensor structure embedded in a micro-mechanical sensor chip includes fabricating the micro-mechanical sensor structure with a protective membrane, arranging the micro-mechanical sensor chip so that a surface of the protective membrane faces toward a second chip, and securing the micro-mechanical sensor chip to the second chip.

Yet another exemplary method of protecting a micro-mechanical sensor structure embedded in a micro-mechanical sensor chip includes configuring the protective membrane at a reduced thickness.

Still another exemplary method is directed to protecting a micro-mechanical sensor structure embedded in a micro-mechanical sensor chip in which the protective membrane is configured using a chemical and mechanical planarization process.

Yet another exemplary method is directed to protecting a micro-mechanical sensor structure embedded in a micro-mechanical sensor chip in which a thickness of the protective membrane is less than 10 microns.

Still another exemplary method of protecting a micro-mechanical sensor structure embedded in a micro-mechanical sensor chip includes configuring a sealing bond ring to surround the micro-mechanical sensor structure.

Yet another exemplary method is directed to protecting a micro-mechanical sensor structure embedded in a micro-mechanical sensor chip in which the protective membrane includes an opening.

Still another exemplary method is directed to protecting a micro-mechanical sensor structure embedded in a micro-mechanical sensor chip in which the protective membrane is configured to be at least partially absent.

Yet another exemplary method of protecting a micro-mechanical sensor structure embedded in a micro-mechanical sensor chip includes applying a bond between the micro-mechanical sensor chip and the second chip to secure the micro-mechanical sensor chip to the second chip.

Still another exemplary method of protecting a micro-mechanical sensor structure embedded in a micro-mechanical sensor chip includes arranging the micro-mechanical sensor chip and the second chip on a package frame to support the micro-mechanical sensor chip and the second chip in a single package, and applying a plastic mold to seal the micro-mechanical sensor chip and the second chip in the single package.

Still another exemplary method of protecting a micro-mechanical sensor structure embedded in a micro-mechanical sensor chip includes arranging at least one additional micro-mechanical sensor chip at least one of on, underneath, and between the micro-mechanical sensor chip and the second chip to provide a multi-sensor device.

Yet another exemplary method is directed to protecting a micro-mechanical sensor structure embedded in a micro-mechanical sensor chip in which the multi-sensor device includes at least one of an accelerometer, a gyroscope, a temperature sensor, and a pressure sensor.

Still another exemplary method is directed to protecting a micro-mechanical sensor structure embedded in a micro-mechanical sensor chip in which the multi-sensor device includes at least one of a multi-dimensional accelerometer and a multi-dimensional gyroscope.

Yet another exemplary method is directed to protecting a micro-mechanical sensor structure embedded in a micro-mechanical sensor chip in which the embedded micro-mechanical sensor structure is sensitive to one of a pressure, an acceleration, a rotation, and a temperature.

Still another exemplary method of protecting a micro-mechanical sensor structure embedded in a micro-mechanical sensor chip in which the second chip is at least one of an electronic integrated circuit chip and an actuator chip.

Yet another exemplary method of protecting a micro-mechanical sensor structure embedded in a micro-mechanical sensor chip includes applying a bond between the micro-mechanical sensor chip and the second chip to secure the micro-mechanical sensor chip to the second chip, arranging the micro-mechanical sensor chip and the second chip on a package frame to support the micro-mechanical sensor chip and the second chip in a single package, and applying a plastic mold to seal the micro-mechanical sensor chip and the second chip in the single package.

Yet another exemplary method is directed to protecting a micro-mechanical sensor structure embedded in a micro-mechanical sensor chip in which the protective membrane is configured using a chemical and mechanical planarization process.

Still another exemplary method is directed to protecting a micro-mechanical sensor structure embedded in a micro-mechanical sensor chip in which a thickness of the protective membrane is less than 10 microns.

Yet another exemplary method of protecting a micro-mechanical sensor structure embedded in a micro-mechanical sensor chip includes configuring a sealing bond ring to surround the micro-mechanical sensor structure, arranging the micro-mechanical sensor chip and the second chip on a package frame to support the micro-mechanical sensor chip and the second chip in a single package, and applying a plastic mold to seal the micro-mechanical sensor chip and the second chip in the single package.

Still another exemplary method is directed to protecting a micro-mechanical sensor structure embedded in a micro-mechanical sensor chip in which the protective membrane includes an opening.

Yet another exemplary method is directed to protecting a micro-mechanical sensor structure embedded in a micro-mechanical sensor chip in which the protective membrane is configured to be at least partially absent.

An exemplary embodiment of a micro-mechanical sensor device includes a first chip and a micro-mechanical sensor chip having an embedded micro-mechanical sensor structure and a protective membrane arranged on the embedded micro-mechanical sensor structure, in which the micro-mechanical sensor chip is arranged onto the first chip so that the protective membrane faces toward the first chip.

Still another exemplary embodiment is directed to a micro-mechanical sensor device in which the protective membrane is configured at a reduced thickness.

Yet another exemplary embodiment is directed to a micro-mechanical sensor device in which a thickness of the protective membrane is less than 10 microns.

Still another exemplary embodiment is directed to a micro-mechanical sensor device including a bond to secure the micro-mechanical sensor chip to the first chip.

Yet another exemplary embodiment is directed to a micro-mechanical sensor device including a sealing bond ring to surround the embedded micro-mechanical structure.

Still another exemplary embodiment is directed to a micro-mechanical sensor device in which the protective membrane includes an opening.

Yet another exemplary embodiment is directed to a micro-mechanical sensor device in which the protective membrane is at least partially absent.

Still another exemplary embodiment is directed to a micro-mechanical sensor device including a package frame to support the first chip and the micro-mechanical sensor chip in a single package, and a plastic mold to seal the first chip and the micro-mechanical sensor chip in the single package.

Yet another exemplary embodiment is directed to a micro-mechanical sensor device in which at least one additional micro-mechanical sensor chip arranged at least one of on, underneath, and between the micro-mechanical sensor chip and the first chip to provide a multi-sensor device.

Still another exemplary embodiment is directed to a micro-mechanical sensor device in which the multi-sensor device includes at least one of an accelerometer, a gyroscope, a temperature sensor, and a pressure sensor.

Yet another exemplary embodiment is directed to a micro-mechanical sensor device in which n the multi-sensor device includes at least one of a multi-dimensional accelerometer and a multi-dimensional gyroscope.

Still another exemplary embodiment is directed to a micro-mechanical sensor device in which the embedded micro-mechanical sensor structure is sensitive to one of a pressure, acceleration, a rotation, and a temperature.

Yet another exemplary embodiment is directed to a micro-mechanical sensor device in which the first chip is at least one of an electronic integrated circuit chip and an actuator chip.

Still another exemplary embodiment is directed to a micro-mechanical sensor device including an RF chip arranged on the micro-mechanical sensor chip for wireless communication.

Yet another exemplary embodiment is directed to a micro-mechanical sensor device including a substrate, wherein a difference in dielectric coefficient for the RF chip as an upper chip and an additional space between the upper RF chip and the substrate provided by the use of the micro-mechanical sensor chip as an intermediate chip provides an improved RF performance.

Still another exemplary embodiment is directed to a micro-mechanical sensor device including a bond to secure the micro-mechanical sensor chip to the first chip, a package frame to support the first chip and the micro-mechanical sensor chip in a single package, and a plastic mold to seal the first chip and the micro-mechanical sensor chip in the single package, in which the protective membrane is configured at a reduced thickness.

Yet another exemplary embodiment is directed to a micro-mechanical sensor device in which a thickness of the protective membrane is less than 10 microns.

Still another exemplary embodiment is directed to a micro-mechanical sensor device including a sealing bond ring to surround the embedded micro-mechanical structure, a package frame to support the first chip and the micro-mechanical sensor chip in a single package, and a plastic mold to seal the first chip and the micro-mechanical sensor chip in the single package, in which the protective membrane is at least partially absent.

An exemplary method of protecting a micro-mechanical sensor structure embedded in a micro-mechanical sensor chip includes fabricating the micro-mechanical sensor structure with a sealing bond to surround the micro-mechanical sensor structure, arranging the micro-mechanical sensor chip so that a surface of the protective membrane faces toward a second chip, and securing the micro-mechanical sensor chip to the second chip.

BRIEF DESCRIPTION OF THE DRAWINGS

FIG. 4A shows a micro-mechanical linear accelerometer sensor chip without a thin protective membrane.

FIG. 4B shows the micro-mechanical linear accelerometer sensor chip of FIG. 4A with a thin protective membrane.

DETAILED DESCRIPTION

Figures 1A, 1B:
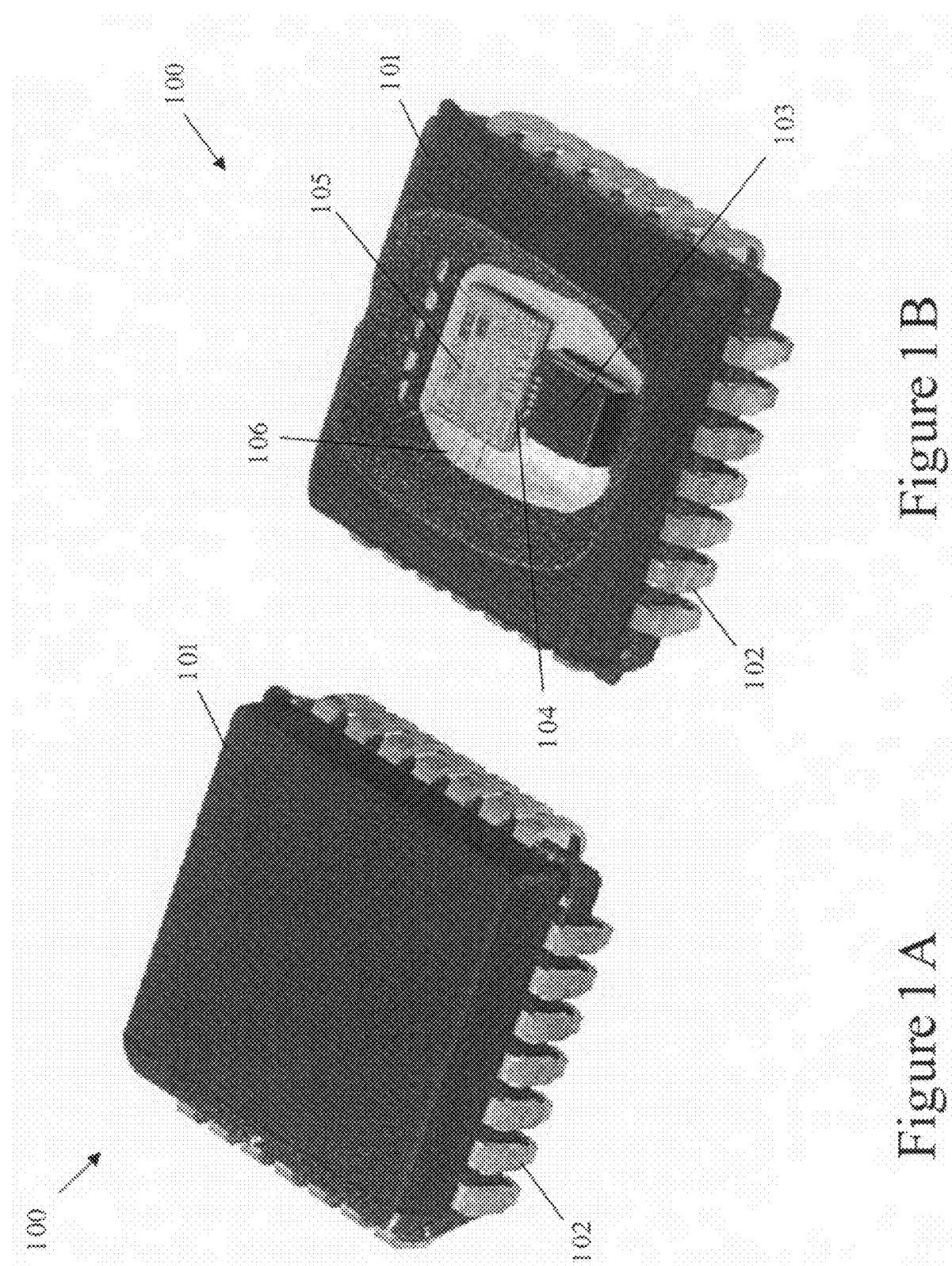
FIG. 1A shows an exterior view of a combined micro-mechanical sensor and electronic integrated circuit package.
FIG. 1B shows an interior view of the combined micro-mechanical sensor and electronic integrated circuit package of FIG. 1A.

FIG. 1A shows an exterior view of a combined micro-mechanical sensor and electronic integrated circuit package 100 having a plastic molding 101 and outside electrical contacts 102. The plastic molding 101 provides a protective covering and mechanical support for the internal components of the combined micro-mechanical sensor and electronic integrated circuit package 100. The outside electrical contacts 102 provide an electrical connection to the internal components of the combined micro-mechanical sensor and electronic integrated circuit package 100.

FIG. 1B shows an interior view of the combined micro-mechanical sensor and electronic integrated circuit package 100 of FIG. 1A showing, in addition to the plastic molding 101 and outside electrical contacts 102, a micro-mechanical sensor chip 103, an electronic integrated circuit chip 105, a first series of bond wires 104, and a second series of bond wires 106. The micro-mechanical sensor chip 103 includes a micro-mechanical sensor structure that produces micro-mechanical sensor signals that may indicate, for example, a sensed pressure, acceleration, or temperature. The electronic integrated circuit chip 105 processes the mechanical sensor signals and communicates with elements outside the package 100. The first series of bond wires 104 provides an electrical connection between the micro-mechanical sensor chip 103 and the electronic integrated circuit chip 105. The second series of bond wires 106 provides an electrical connection between the electronic integrated circuit chip 105 and the outside electrical contacts 102.

As shown in FIG. 1B, the electronic integrated circuit chip 105 and the micro-mechanical sensor chip 103 are arranged next to each other within the same plastic molding 101. Such an arrangement, however, may limit the overall reduction in size that may be achieved for the combined micro-mechanical sensor and electronic integrated package 100.

Figure 2:
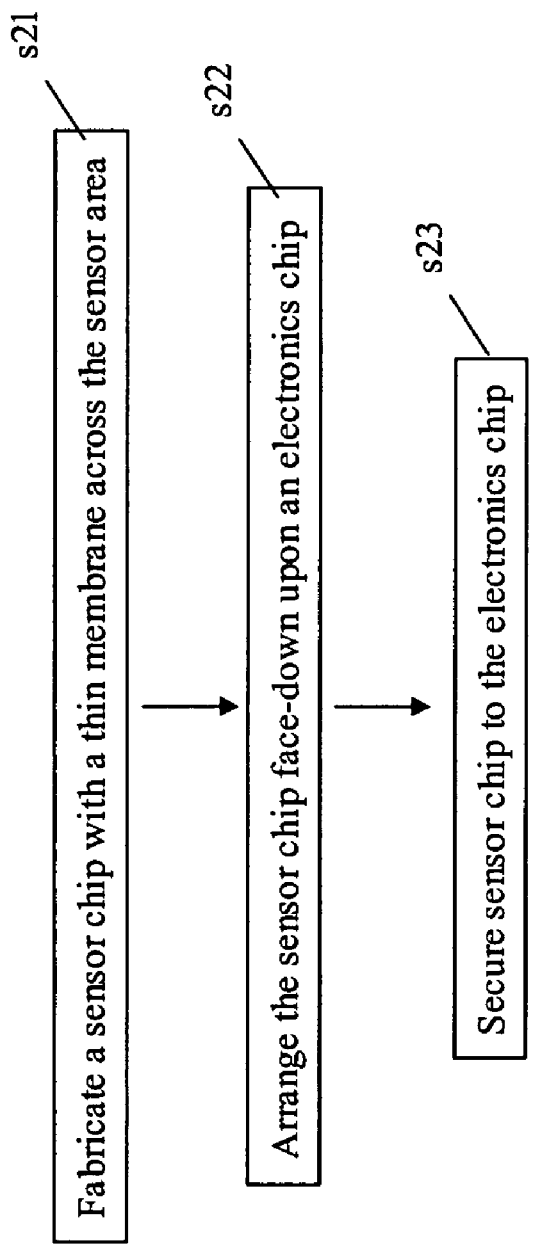
FIG. 2 shows an exemplary method to protect a micro-mechanical sensor structure embedded in a micro-mechanical sensor chip.

FIG. 2 shows an exemplary method to protect a micro-mechanical sensor structure embedded in a micro-mechanical sensor chip. In step s21, the micro-mechanical sensor chip is fabricated with a thin protective membrane to cover a sensitive area of the embedded micro-mechanical sensor structure. In step s22, the micro-mechanical sensor chip is arranged face-down onto an electronic integrated circuit chip so that the thin membrane is covered and/or supported by the underlying electronic integrated circuit chip. In step s23, the micro-mechanical sensor chip is secured to the electronic integrated circuit chip.

FIGS. 2A through 2E demonstrate an exemplary production method and process to fabricate a micro-mechanical sensor chip with an additional thin membrane layer to shield and protect an embedded micro-mechanical sensor structure.

Figure 2A:
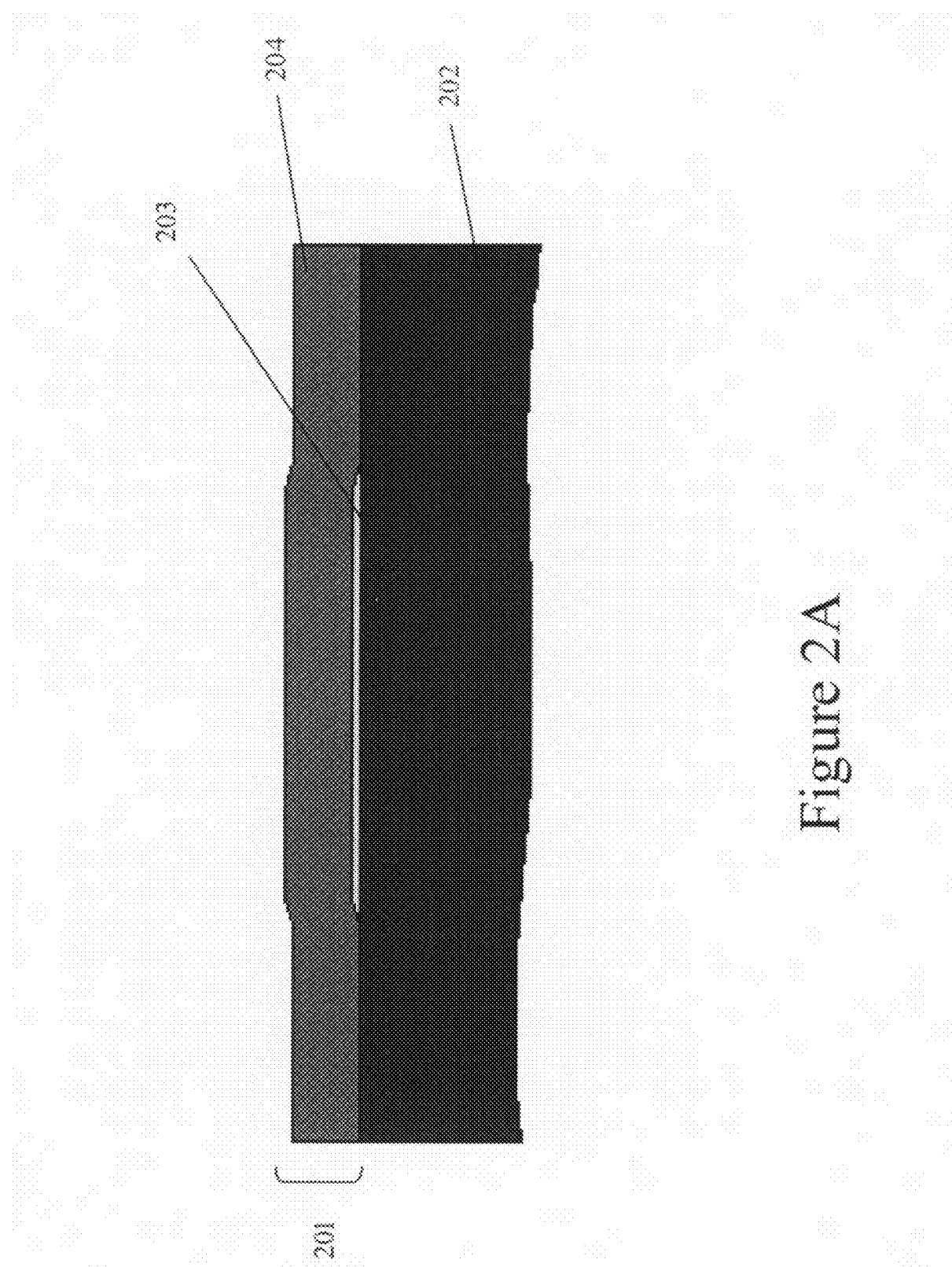
FIG. 2A shows a structured layer deposited onto a substrate wafer.

In FIG. 2A, a structured layer 201 is deposited on a substrate wafer 202 so that a first oxide layer 203 made from, for example, an electrically non-conducting material such as silicon dioxide, is followed by a first conducting layer 204 made from, for example, an electrically conducting material such as silicon. The substrate wafer 202 may also be made from, for example, an electrically conducting material such as silicon.

Figure 2B:
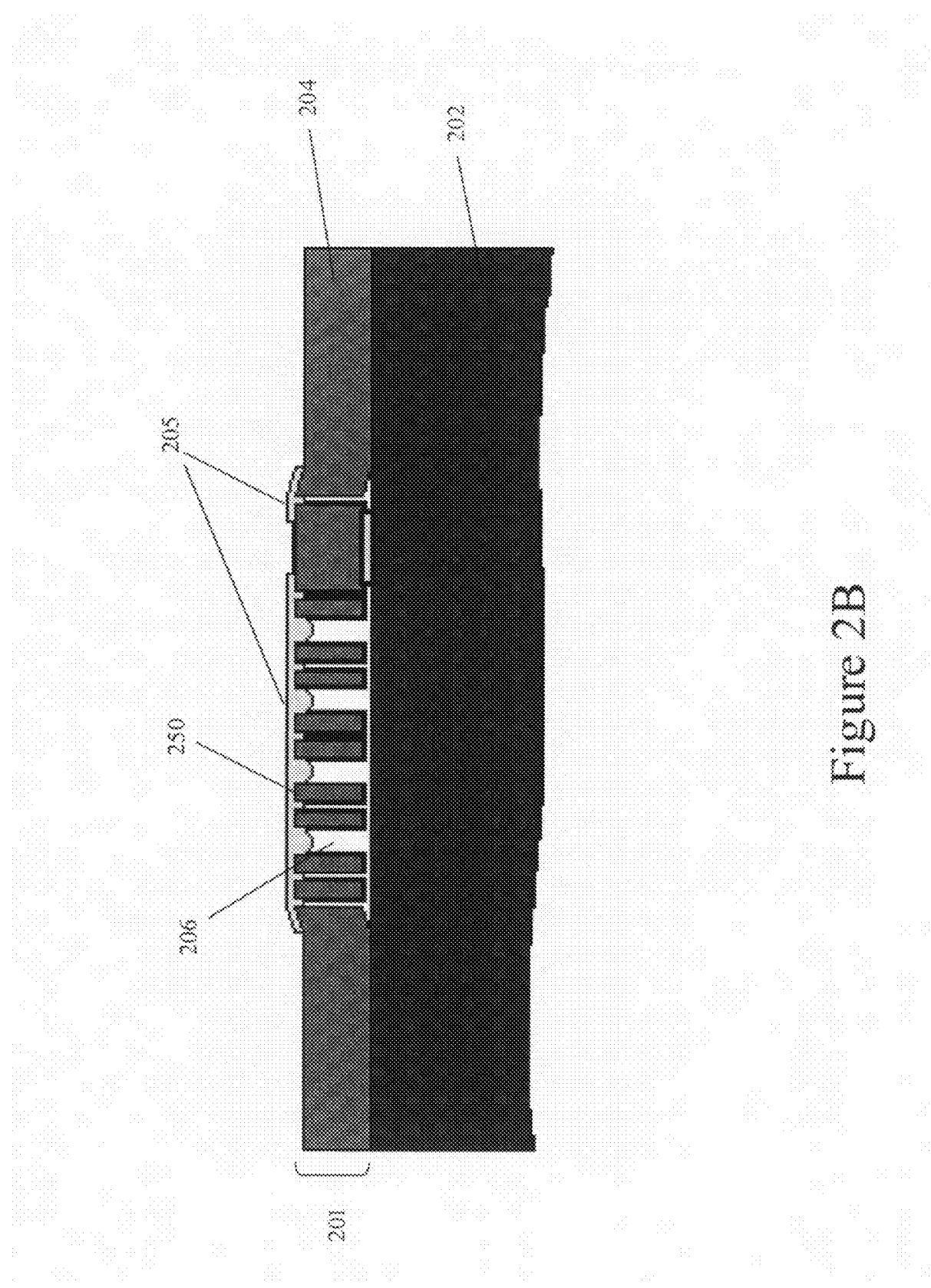
FIG. 2B shows an oxide layer deposited on the structured layer.

In FIG. 2B, a second oxide layer 205 made from, for example, a non-conducting material such as silicon, is deposited on the structured layer 201 to close gaps 206 within the structured layer 201 between structured micro-mechanical beams 250 which may be supported on at least one side and grouped in pairs so that one of each of the paired micro-mechanical beams 250 is mounted to the substrate wafer 202 while its counterpart is suspended by springs.

Figure 2C:
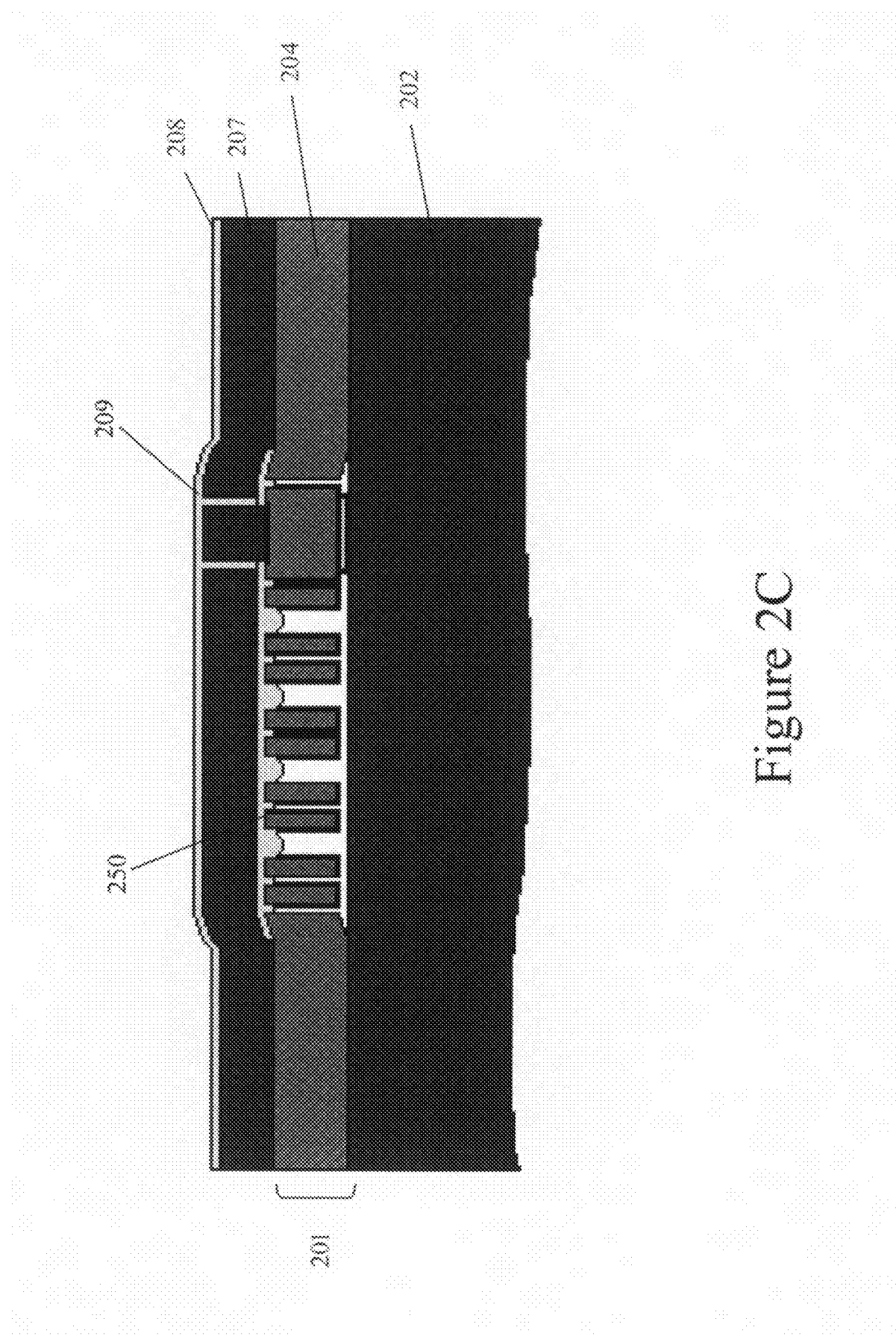
FIG. 2C shows a conducting layer deposited on the oxide layer.

In FIG. 2C, a second conducting layer 207 made from, for example, an electrically conducting material such as silicon, is deposited and then structured to provide electrical contacts to the micro-mechanical beams 250. A third oxide layer 208, made from, for example, a non-conducting material such as silicon dioxide, is then deposited to fill the gap(s) 209 between the electrical contact areas and the remaining surface.

Figure 2D:
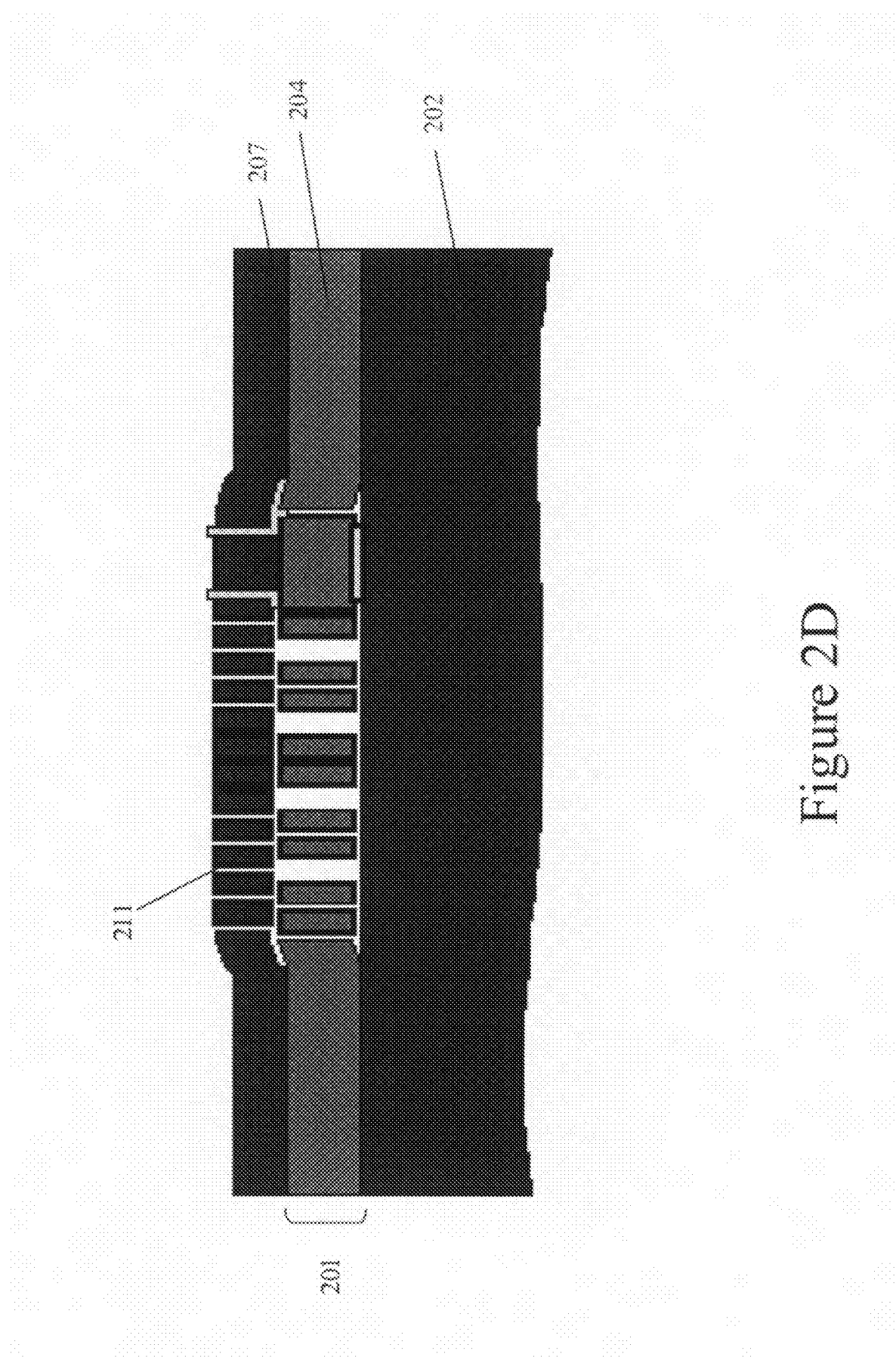
FIG. 2D shows an oxide layer removed and an opened conducting layer.

In FIG. 2D, the third oxide layer 208 is removed and the second conducting layer 207 is opened (i.e., structured) to allow removal of the second oxide layer 205 via an etching process, such as, for example, chemical etching, which produces etch holes 211. In this manner, the second oxide layer 205 may function, for example, as a sacrificial layer.

Figure 2E:
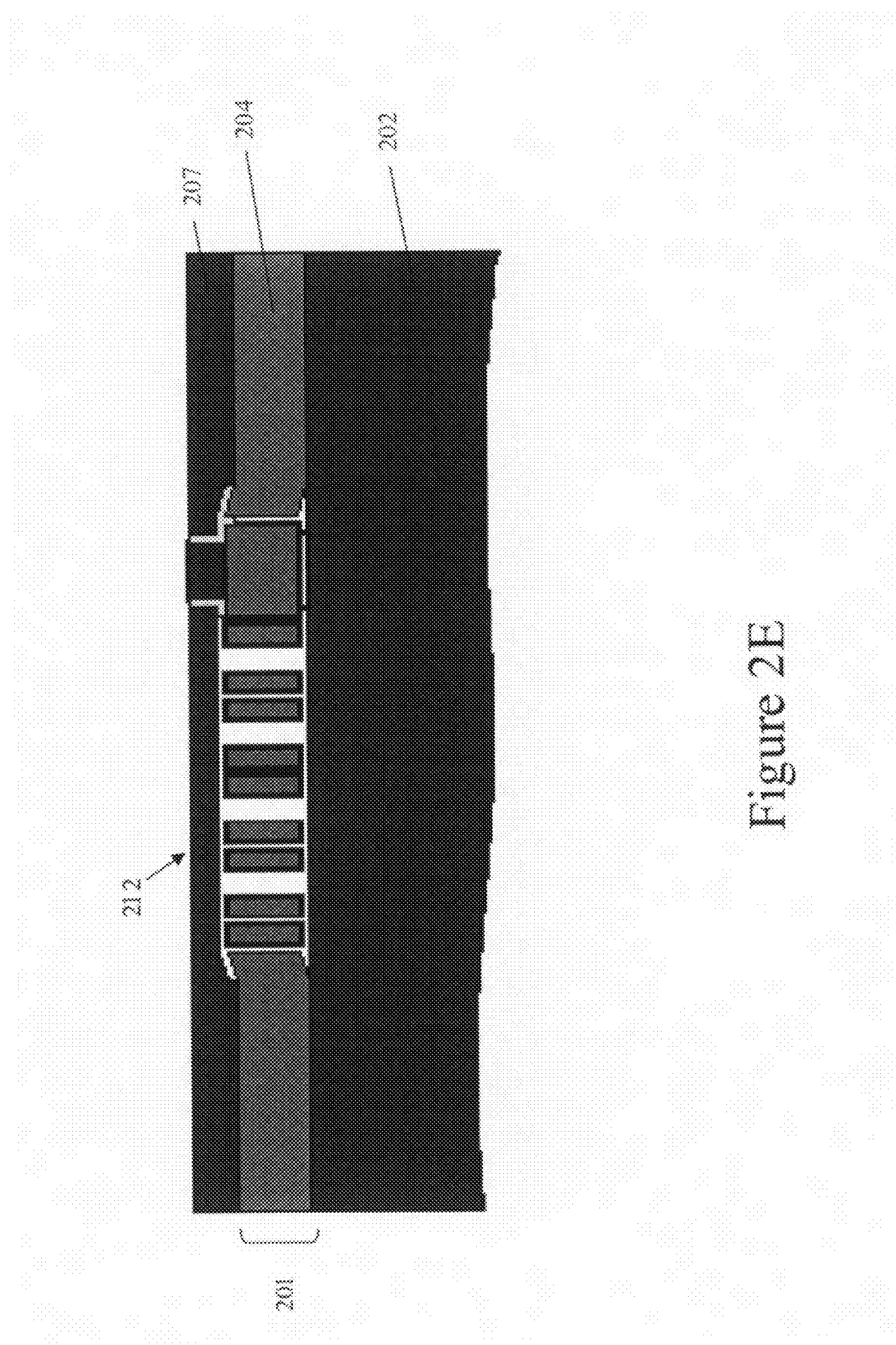
FIG. 2E shows filled etch holes and a planarized smooth surface.

In FIG. 2E, the etch holes 211 in the second conducting layer 207 are filled with a conducting material, such as, for example, silicon and the entire wafer is planarized or polished, to obtain a smooth surface 212, which provides a thin membrane layer protecting the underlying micro-mechanical sensor structure. The planarization or polishing may be performed using a chemical and mechanical polishing or planarization (CMP) process in which mechanical particles polish the surface while a chemical acid or base is present. It is believed the chemical component of the CMP process should provide a smoother surface since sharp scratches may be etched away.

The exemplary method process described in FIGS. 2A through 2E may produce a thin membrane covering a micro-mechanical sensor structure embedded within a micro-mechanical sensor chip. However, if left exposed without taking further measures, the thin membrane covering the micro-mechanical sensor structure may not be strong enough to withstand the relatively high pressures that may exist during plastic molding, whereupon melted plastic is pressed onto a mold containing a metal frame holding the micro-mechanical sensor chip. The required strength of the membrane and therefore its required thickness may depend on a number of factors, including, for example, the length or diameter of the surface to be covered, the particular plastic molding process utilized, and the particular environmental conditions.

Figure 3A:
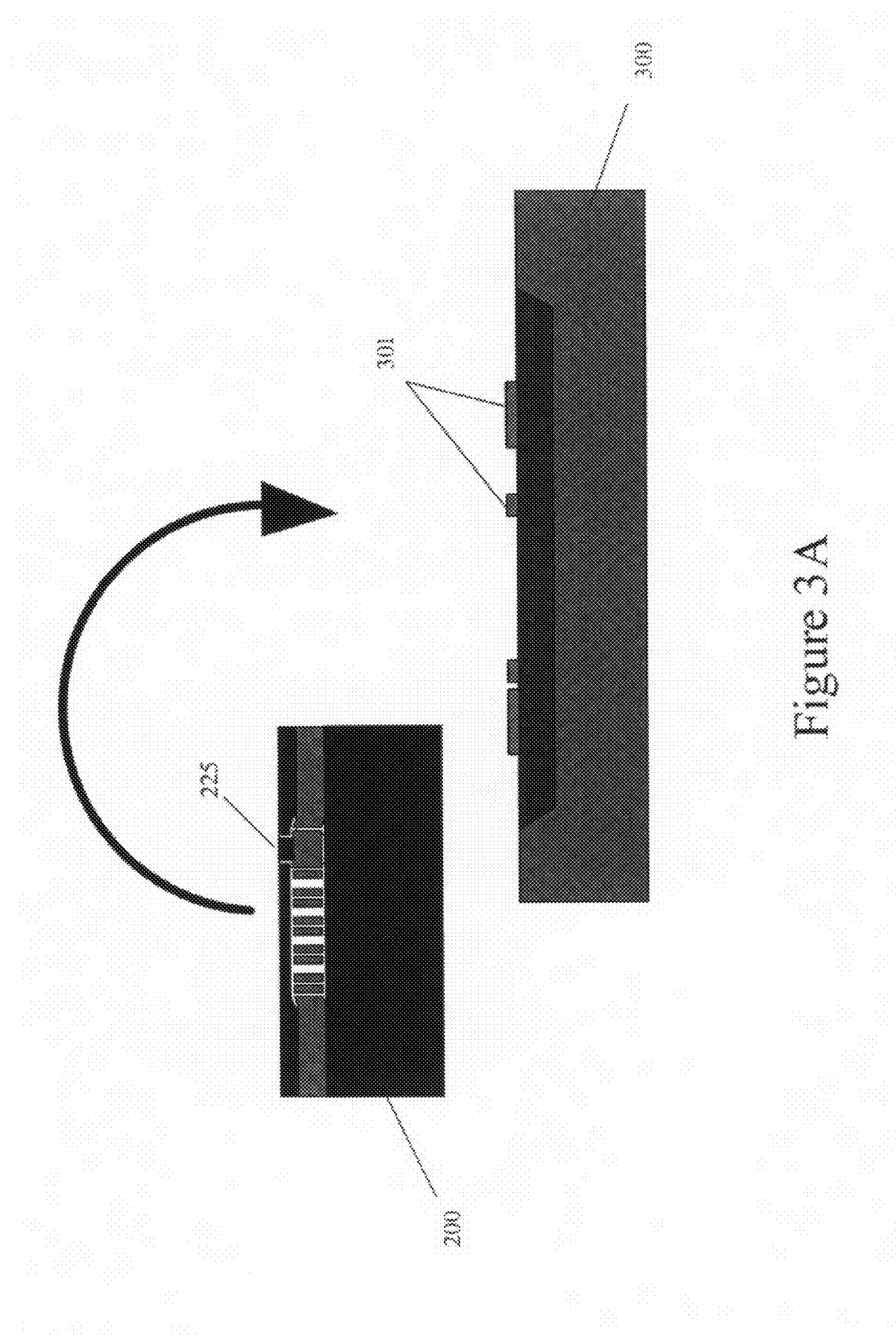
FIG. 3A shows an exemplary flipping of a micro-mechanical sensor chip onto a electronic integrated circuit chip.
Figure 3B:
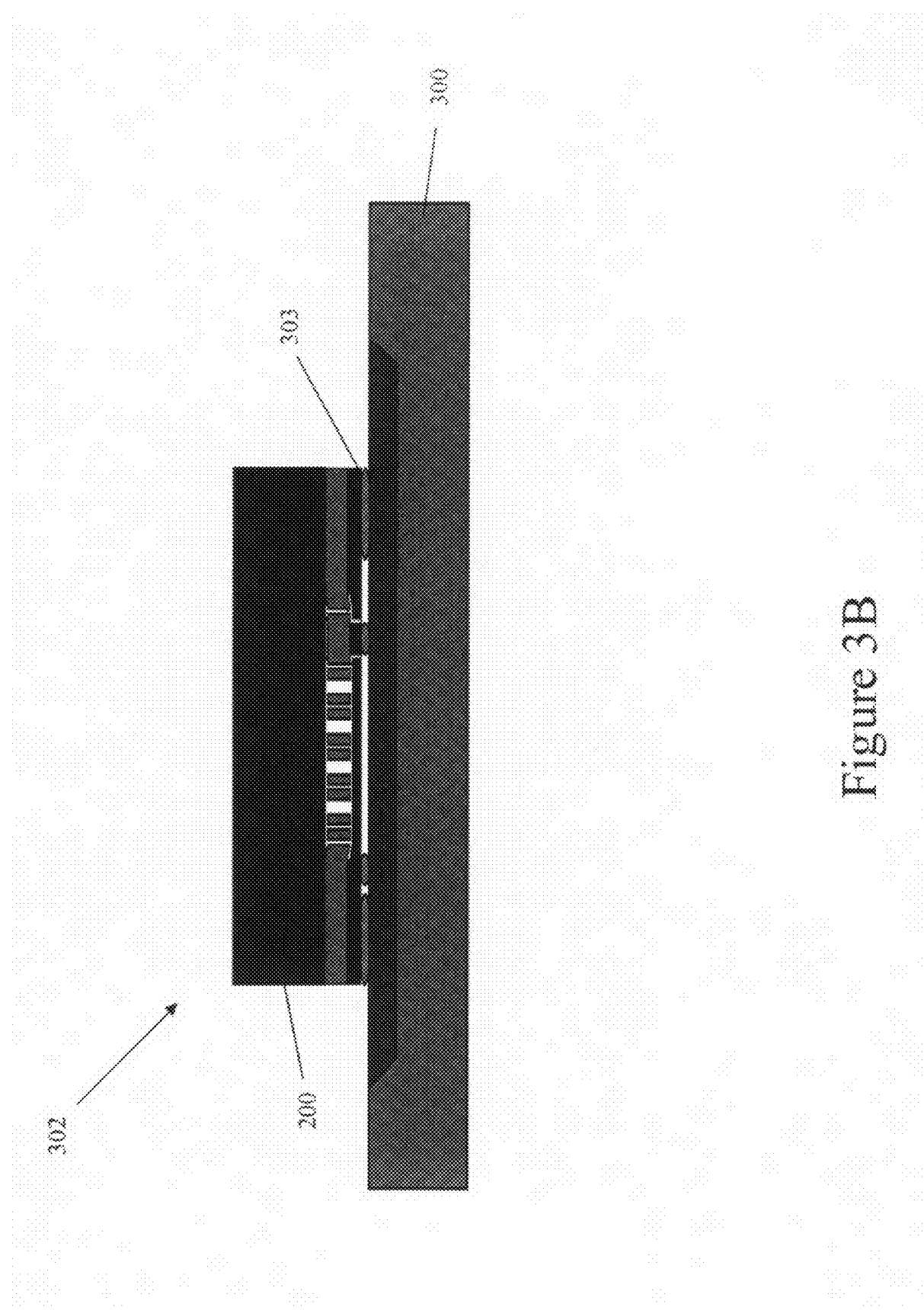
FIG. 3B shows a combined arrangement of a micro-mechanical sensor chip and an electronic integrated circuit chip.
Figure 3C:
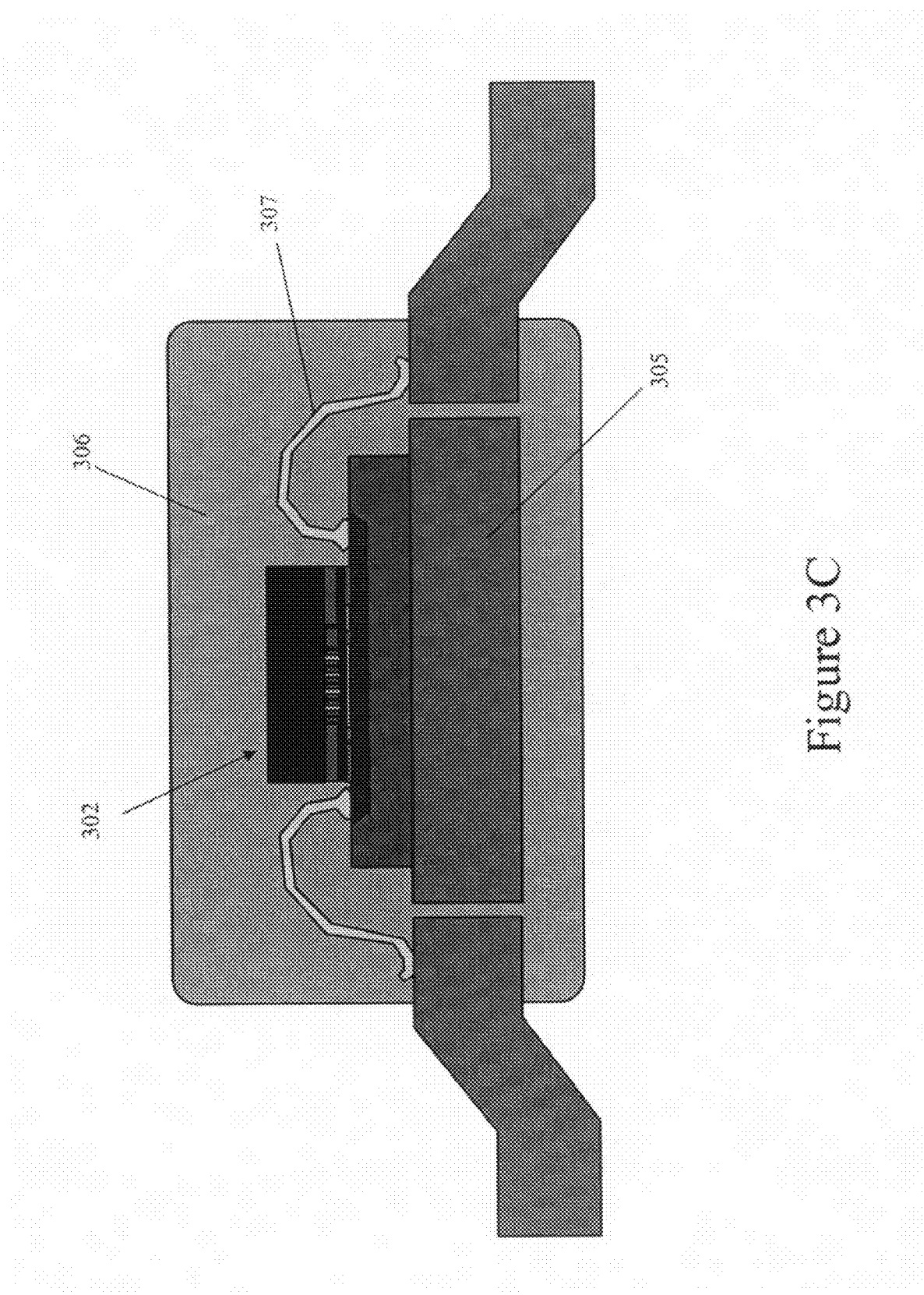
FIG. 3C shows the combined arrangement of a micro-mechanical sensor chip and electronic integrated circuit chip further stacked onto a package frame and sealed with a plastic mold.

FIGS. 3A through 3C demonstrate an exemplary method to package a micro-mechanical sensor chip 200 whose embedded micro-mechanical sensor structure has been encapsulated with a thin protective membrane using the exemplary method and process described in FIGS. 2A through 2E. It is believed that the exemplary method and process should permit the thin protective membrane to withstand the relatively high pressures that may exist during plastic molding without damaging to the encapsulated micro-mechanical sensor structure.

In FIG. 3A, the micro-mechanical sensor chip 200, acting as the upper chip, is flipped face-down onto an underlying electronic integrated circuit chip 300 so that the contact areas 225 of the micro-mechanical sensor chip 200 match the contact areas 301 of the electronic integrated circuit chip 300.

FIG. 3B shows the combined stacked arrangement 302 of the flipped micro-mechanical sensor chip 200 whose embedded micro-mechanical sensor structure now faces the underlying electronic integrated circuit chip 300. In this configuration, the electronic integrated circuit chip 300 may provide additional shielding and support to the micro-mechanical sensor chip 200 so that the overall mechanical stability of the micro-mechanical sensor chip 200 is enhanced, while at the same time, permitting a reduction in the required thickness of the protective membrane encapsulating the embedded micro-mechanical sensor structure. A mechanical bond 303 may also be provided to further enhance the mechanical stability.

FIG. 3C shows the combined stack arrangement 302 of the micro-mechanical sensor chip 200 and electronic integrated circuit chip 300 further stacked onto a package frame 305 and sealed with a plastic mold 306. Bond wires 307 secure the combined stack arrangement 302 to the package frame 305 and ensure electrical connectivity to the outside of the package. Such an arrangement in which the micro-mechanical sensor chip 200 is flipped face-down onto the electronic integrated circuit chip 300 is intended to reduce the overall package size by reducing and/or eliminating the protective membrane, as well as the required number of bond wires. In particular, it is believed that the protective membrane may be reduced, for example, to a thickness of between about 10 microns to 0.1 microns. The protective membrane may be reduced further, for example, to less than 0.1 microns depending on various factors, including, for example, the length or diameter of the surface to be protected, the particular plastic molding process utilized, and the particular environmental conditions.

It is understood that other flipped arrangements of the micro-mechanical sensor 200 and the electronic integrated circuit chip 300 may be provided. For example, although it may be desirable to flip the micro-mechanical sensor chip 200 onto of the electronic integrated circuit chip 300, the electronic integrated circuit chip 300 may alternatively be flipped onto the micro-mechanical sensor chip 200. The alternative flipped arrangements of the micro-mechanical sensor chip and electronic integrated circuit chip may be implemented in a variety of applications including, for example, a micro-mechanical accelerometer and a micro-mechanical gyroscope.

FIG. 4A shows a micro-mechanical linear accelerometer sensor chip 400 having an embedded micro-mechanical sensor structure 401 and electrical contact pads 402 arranged along an outer edge of the micro-mechanical sensor chip 400. The micro-mechanical sensor structure 401 is sensitive to a linear movement in a direction along sensitivity axis X. The electrical contact pads 402 provide an electrical connection to the internal components of the micro-mechanical linear accelerometer sensor chip 400. The electrical contact pads 402 may also provide a convenient attachment point for bond wires which, in addition to completing the electrical connection, may secure the micro-mechanical linear accelerometer chip 400 to one or more other package elements, such as, for example, another micro-chip or a substrate wafer.

FIG. 4B shows the micro-mechanical linear accelerometer sensor chip 400 of FIG. 4A having a thin film or membrane 403 covering the micro-mechanical sensor structure 401 to protect it from undesired contaminants (such as, for example, dust or dirt) or potentially harmful environmental conditions (such as, for example, heat and moisture). Although dependent on many factors as explained above, the membrane 403 may be configured, for example, to a width of 50 µm to 200 µm, and a thickness of about 2 µm to 0.5 µm, or less.

Figure 5A:
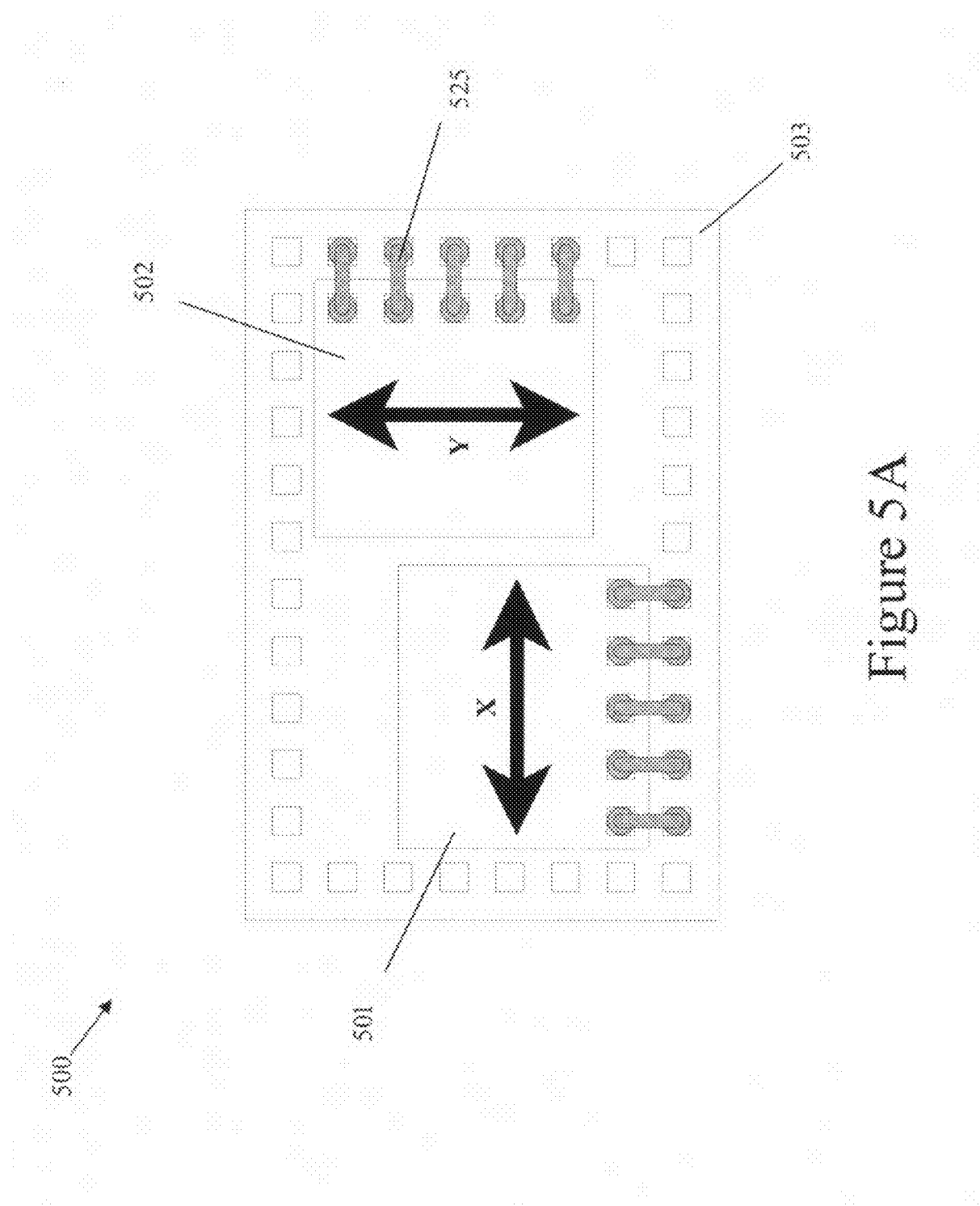
FIG. 5A shows an exemplary arrangement for a two-dimensional accelerometer in which two micro-mechanical linear accelerometer sensor chips are secured and electrically connected to an underlying electronic integrated circuit chip via bond wires.

FIG. 5A shows an exemplary arrangement 500 for a two-dimensional accelerometer in which two micro-mechanical linear accelerometer sensor chips 501 and 502 are secured and electrically connected to an underlying electronic integrated circuit chip 503 via bond wires 525. The two micro-mechanical linear accelerometer sensor chips 501 and 502 are arranged face-down so that the thin membranes which cover the embedded micro-mechanical sensor structures face the electronic integrated circuit chip 503. The two micro-mechanical linear accelerometer sensor chips 501 and 502 are further arranged so that they are sensitive to linear movements along axises that are perpendicular to each other. In particular, micro-mechanical linear accelerometer sensor chip 501 is arranged to be sensitive to a linear movement in a direction along axis X, and micro-mechanical linear accelerometer sensor chip 502 is arranged to be sensitive to a linear movement in a direction along axis Y which is perpendicular to axis X.

Figure 5B:
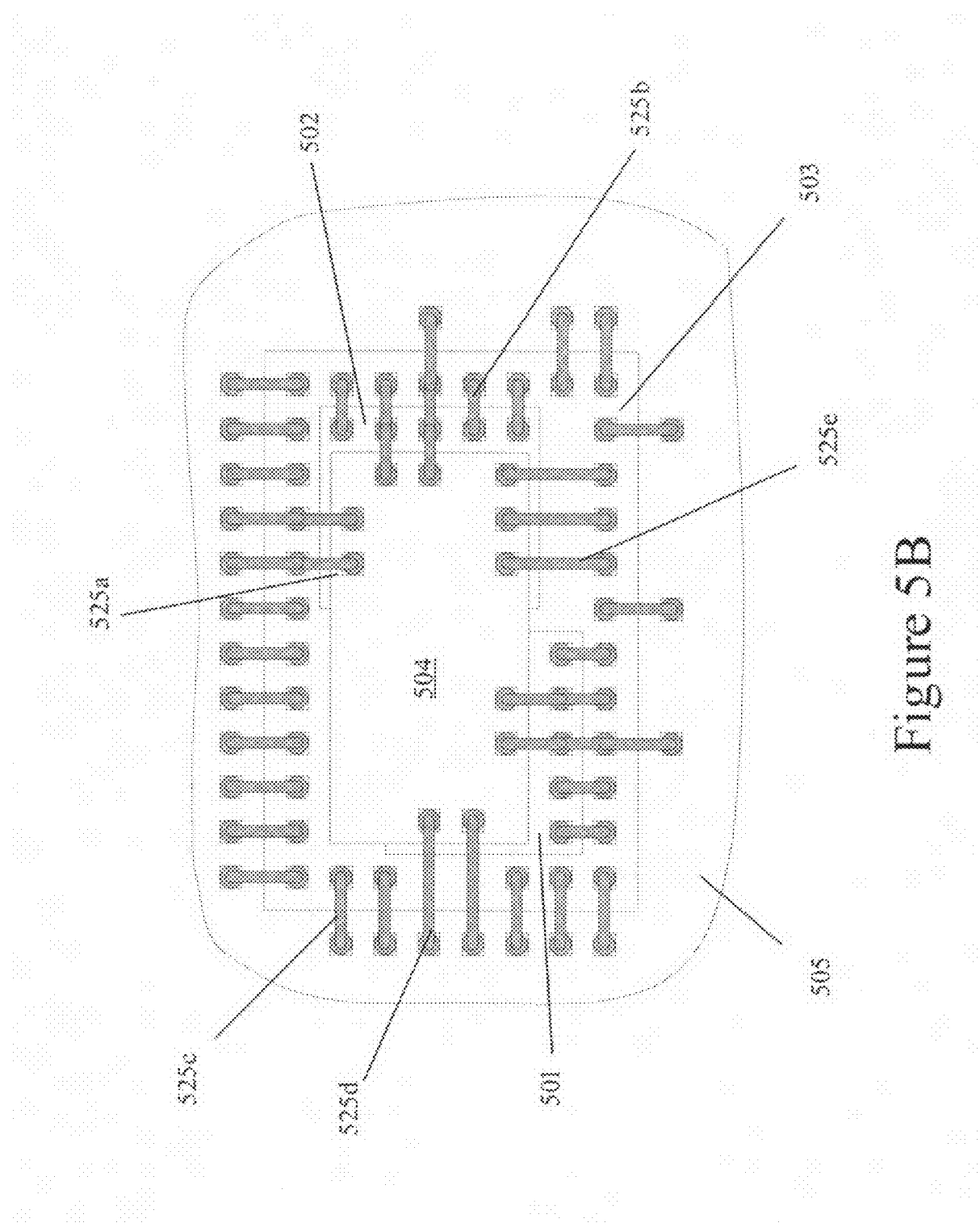
FIG. 5B shows the exemplary arrangement of FIG. 5A with an additional top chip, substrate wafer, and additional bond wires.

FIG. 5B shows the exemplary arrangement of FIG. 5B with an additional top chip 504, substrate wafer 505, and additional bond wires 525a-525e. The top chip 505 is arranged on the two micro-mechanical linear accelerometer chips 501 and 502, the substrate wafer 505 is arranged underneath the electronic integrated circuit chip 503, and the additional bond wires 425a-425e are arranged on contact pads to secure and electrically connect the entire package. In particular, bond wires 525a secure and electrically connect the top chip 504 to an intermediate micro-mechanical linear accelerometer chips 501 or 502, bond wires 525b secure and electrically connect an intermediate micro-mechanical linear accelerometer sensor chip 501 or 502 to the electronic integrated circuit chip 503, bond wires 525c secure and electrically connect the electronic integrated circuit chip 503 to the substrate wafer 505, bond wires 525d secure and electrically connect the top chip 504 to the substrate wager 505, and bond wires 525e secure and electrically connect top chip 504 to the the electronic integrated circuit chip 503. Other configurations of the bond wires 525 may be provided, such as, for example, a configuration of the bond wires between the two intermediate micro-mechanical liner accelerometer sensor chips 501 or 502 and the substrate wafer 505.

In this configuration, one or more of the two micro-mechanical linear accelerometer sensor chips may be arranged face-up so that the thin membrane encapsulating the embedded micro-mechanical sensor structure faces the top chip 504 which covers the thin membrane providing addition mechanical support and protection from undesired contaminants and/or potentially harmful environmental conditions.

Figure 5C:
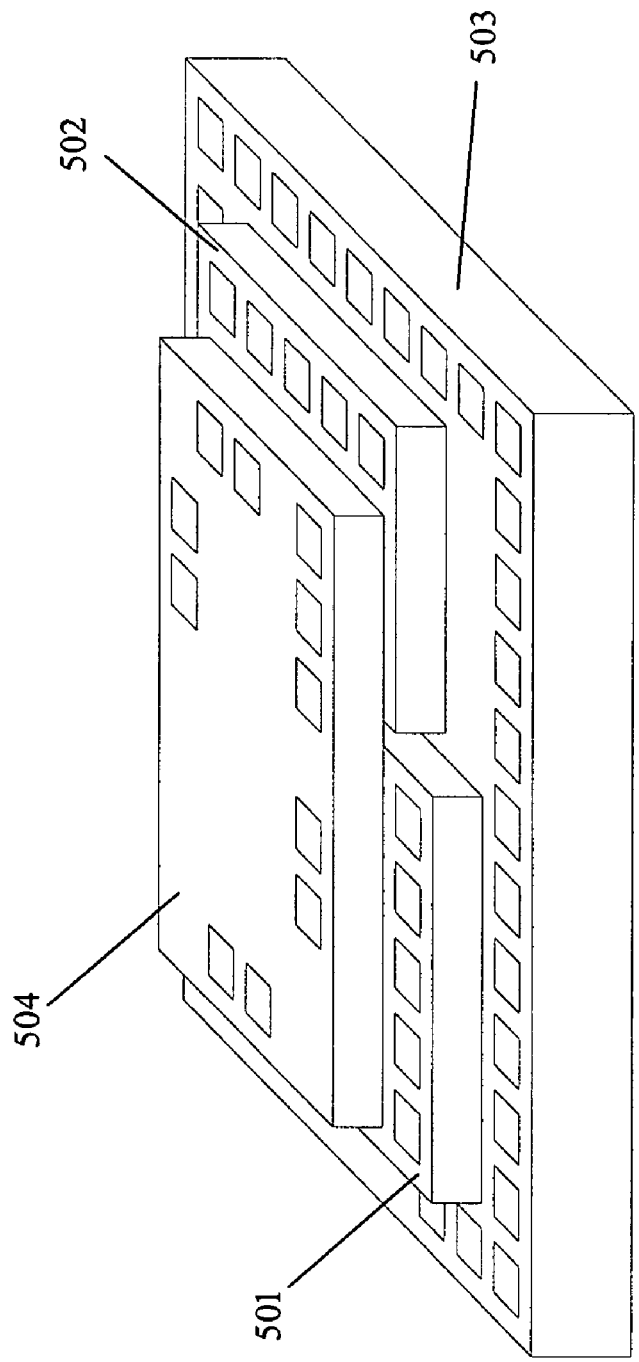
FIG. 5C shows the arrangement of FIG. 5B in a perspective side view without bond wires.

FIG. 5C shows the arrangement of FIG. 5B in a perspective side view without bond wires.

Figures 6A, 6B:
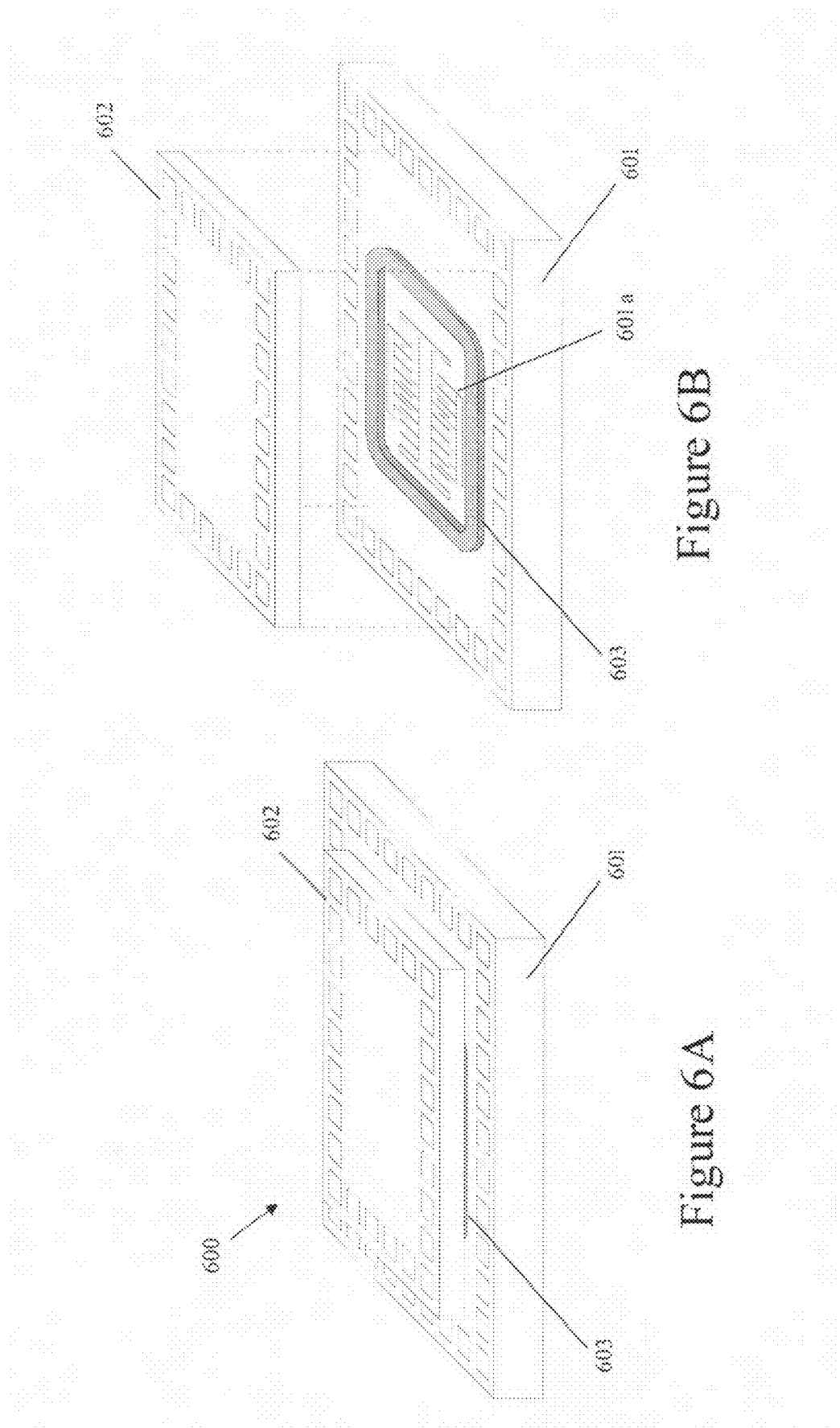
FIG. 6A shows an exemplary arrangement to protect a micro-mechanical sensor structure of a micro-mechanical sensor chip without the need for a thin membrane to cover its sensitive area.
FIG. 6B shows the electronic integrated circuit chip lifted away from the micro-mechanical sensor chip so that the sealing bond ring may be fully viewed.

FIG. 6A shows an exemplary arrangement 600 to protect a micro-mechanical sensor structure of a micro-mechanical sensor chip without the need for a thin membrane to cover its sensitive area. The exemplary arrangement 600 includes a micro-mechanical sensor chip 601, an electronic integrated circuit chip 602, and a sealing bond ring 603. The electronic integrated circuit chip 602 is arranged on the micro-mechanical sensor chip 601 and the sealing bond ring 603 is arranged between them. The sealing bond ring 603 provides a seal between the micro-mechanical sensor chip 601 and the electronic integrated circuit chip 602 to prevent undesired contaminants and/or potential harmful environmental conditions from entering between the micro-mechanical sensor chip 601 and the electronic integrated circuit chip 602. Additionally, the sealing bond 603 may even out stress due to punctual bonds. In FIG. 6A, the sealing bond ring 603 is only partially visible.

FIG. 6B shows the electronic integrated circuit chip 602 lifted away from the micro-mechanical sensor chip 601 so that the sealing bond ring 603 may be fully viewed. The sealing bond ring 603 surrounds the micro-mechanical sensor structure 601a which is embedded within the micro-mechanical sensor chip 601 and exposed without a protective thin film covering it. Alternatively, if additional protection is required, the micro-mechanical sensor structure 601a may be both surrounded by the sealing bond ring 603 and shielded with a thin protective membrane layer.

Figure 7:
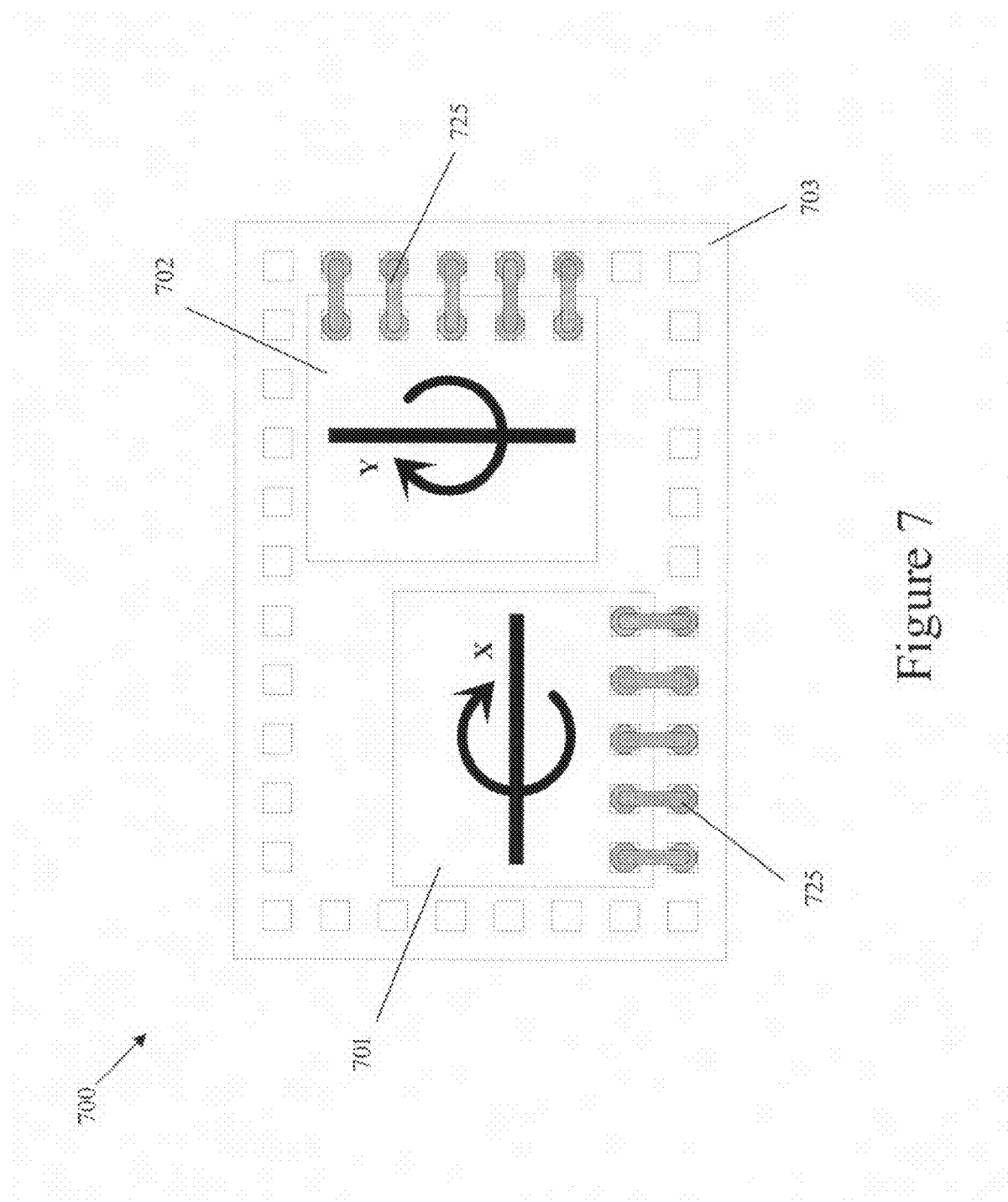
FIG. 7 shows an exemplary arrangement for a two-dimensional gyroscope in which two rotationally-sensitive micro-mechanical sensor chips are secured and electrically connected to an underlying electronic integrated circuit chip via bond wires.

FIG. 7 shows an exemplary arrangement 700 for a two-dimensional gyroscope in which two rotationally-sensitive micro-mechanical sensor chips 701 and 702 are secured and electrically connected to an underlying electronic integrated circuit chip 703 via bond wires 725. The rotationally-sensitive micro-mechanical sensor chips 701 and 702 are arranged face-down so that the thin membrane encapsulating the embedded micro-mechanical sensor structures faces the electronic integrated circuit chip 702. The rotationally-sensitive micro-mechanical sensor chips 701 and 702 are further arranged so that they are sensitive to rotational movements about axises that are perpendicular to each other. In particular, rotationally-sensitive micro-mechanical sensor chip 701 is arranged to be sensitive to a rotational movement about an axis X and rotationally-sensitive micro-mechanical sensor chip 702 is arranged to be sensitive to a rotational movement about axis Y, which is perpendicular to axis X.

Several micro-mechanical sensor chips with thin protective membranes covering their micro-mechanical sensor structures may be stacked upon, underneath, or in conjunction with one or more electronic integrated circuit chips to provide a variety of combined micro-mechanical sensor/electronic integrated circuit chip configurations for a wide variety of micro-mechanical sensor applications. For example, such a multi-layer arrangement of micro-mechanical sensor chips with electronic integrated circuit chips may be used to create a multi-dimensional micro-mechanical accelerometer, gyroscope, or other sensory device by stacking multiple micro-mechanical sensor chips having thin protective membranes onto, underneath, or in conjunction with one or more electronic integrated circuit or other types of micro-chips.

Figure 8:
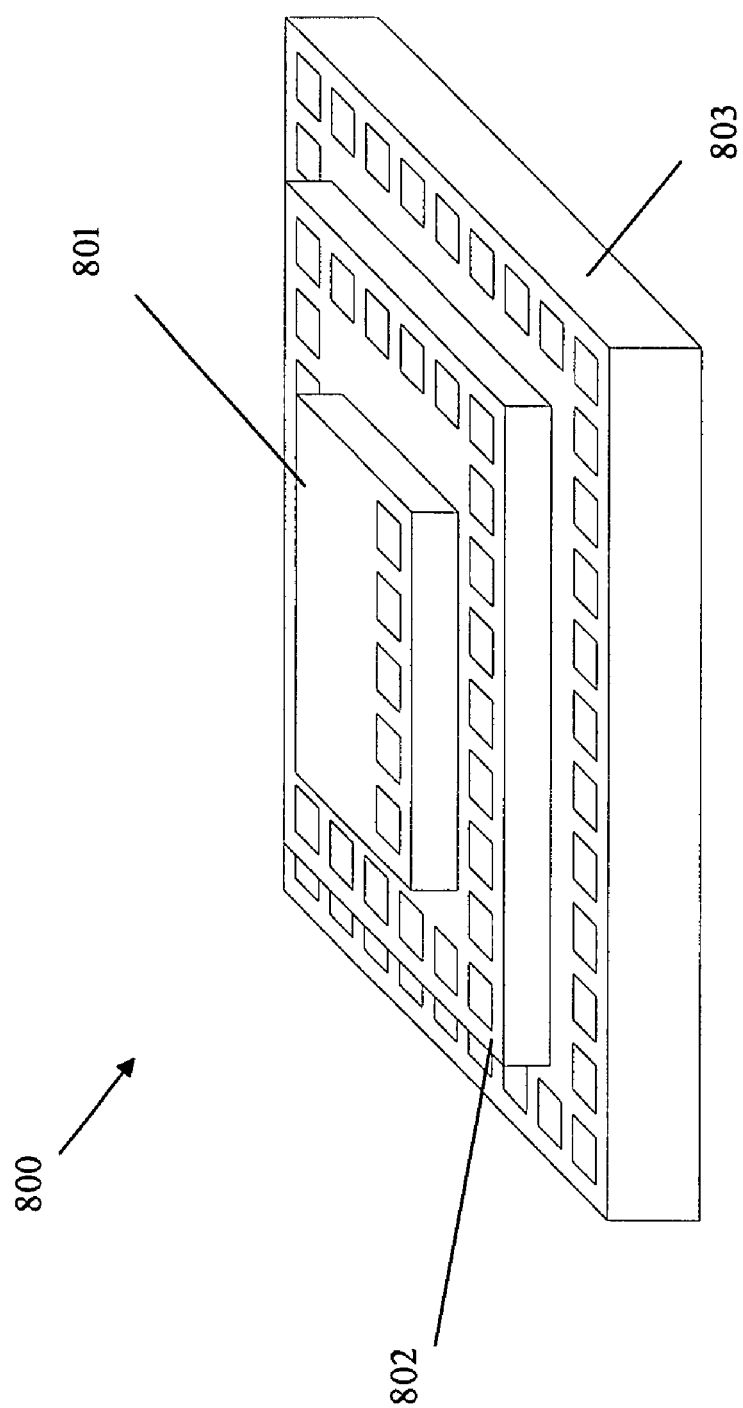
FIG. 8 shows an exemplary multi-layer micro-mechanical sensor arrangement for stacking several micro-mechanical sensor chips on one or more electronic integrated circuit chips to provide a variety of micro-mechanical sensor configurations and applications.

FIG. 8 shows an exemplary multi-layer micro-mechanical sensor arrangement 800 for stacking several micro-mechanical sensor chips on one or more electronic integrated circuit chips to provide a variety of micro-mechanical sensor configurations and applications. The exemplary multi-layer micro-mechanical sensor arrangement 800 includes two micro-mechanical sensor chips 801 and 802 and an electronic integrated circuit chip 803. A first micro-mechanical sensor chip 801 is arranged face-down on a second micro-mechanical sensor chip 802, which is arranged on the underlying electronic integrated circuit chip 803. The exemplary multi-layer micro-mechanical sensor arrangement 800 may be used to create a multi-dimensional micro-mechanical accelerometer, gyroscope, or other sensory device by stacking multiple micro-mechanical accelerometer chips onto one or more electronic integrated circuit chips.

Figure 9:
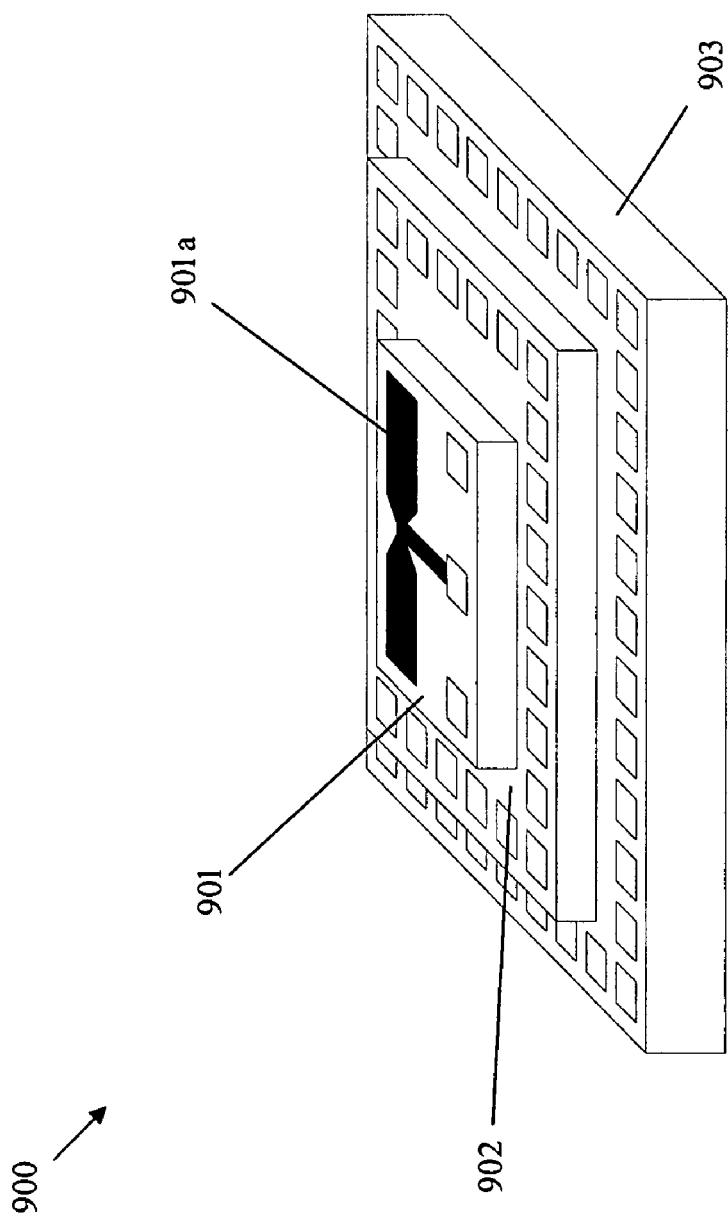
FIG. 9 shows an exemplary multi-layer micro-mechanical sensor arrangement for a combined micro-mechanical sensor and wireless communication device.

FIG. 9 shows an exemplary multi-layer micro-mechanical sensor arrangement 900 for a combined micro-mechanical sensor and wireless communication device. The exemplary multi-layer micro-mechanical sensor arrangement 900 includes an RF chip 901, a micro-mechanical sensor chip 902, and an electronic integrated circuit chip 903. The RF chip 901 includes an antennae 901a for wireless communication. The micro-mechanical sensor chip 902 includes a micro-mechanical sensor structure that may be sensitive to, for example, a change in pressure, movement, acceleration, or temperature. The micro-mechanical sensor structure is encapsulated by a thin membrane.

In the exemplary multi-layer micro-mechanical sensor arrangement 900, the RF chip 901 is arranged on the micro-mechanical sensor chip 902 and the electronic integrated circuit chip 903 is arranged underneath so that the thin membrane encapsulating the embedded micro-mechanical sensor structure may be shielded and protected from either above or below.

Alternatively, other arrangements of the RF chip 901 and the micro-mechanical sensor chip 902 may be provided. For example, instead of the RF chip 901 being arranged on the micro-mechanical sensor chip 902 and the electronic integrated circuit chip 903 being arranged underneath, the micro-mechanical sensor chip 902 may be arranged on the RF chip 901, or the electronic integrated circuit chip 903 may be arranged on the RF chip 901 and the micro-mechanical sensor chip 902 is arranged underneath. However, it is believed that the difference in dielectric coefficient for the RF chip 901 as the upper chip and the additional space between the upper RF chip and the substrate provided by the use of the micro-mechanical sensor chip 902 as the intermediate chip may provide a better RF performance.

The RF chip 902 may include high speed electronic circuitry on a Gallium Arsenic (GaAs) substrate to provide advanced detection techniques for microwave technologies since the thin membrane(s) protecting the embedded micro-mechanical sensor structure(s) may permit detection of various penetration characteristics.

The multi-layer and/or multi-sensor arrangement of micro-mechanical sensor chips may provide a wide variety of combined micro-mechanical sensor devices despite a diverse set of required working environments (e.g., a micro-mechanical accelerometer may perform best at an atmospheric pressure while a micro-mechanical gyroscope may perform best at nearly a vacuum). In particular, the combined micro-mechanical sensor device may include, for example, a combination of a single or multi-dimensional gyroscope with a single or multi-dimensional accelerometer, an RF sensor with either or both a single or multi-dimensional gyroscope and a single or multi-dimensional accelerometer, a temperature sensor and/or an RF sensor with either or both a single or multi-dimensional gyroscope and a single or multi-dimensional accelerometer, etc., or any combination thereof.

Although exemplary embodiments and/or exemplary methods have been described using an electronic integrated circuit and/or sensor chips to shield and protect the embedded micro-mechanical sensor structure, other chips may also be used. For example, the flipped micro-mechanical sensor chip may be combined with an actuator chip (e.g., changing properties of a chip due to magnetic or electric fields, temperature, mechanical pressure, etc.).

What is claimed is:

1. A method of protecting a micro-mechanical sensor structure embedded in a micro-mechanical sensor chip, comprising:

fabricating the micro-mechanical sensor structure with a protective membrane arranged on, and to directly cover, the embedded micro-mechanical sensor structure;

arranging the micro-mechanical sensor chip directly onto a second chip so that the protective membrane faces toward the second chip; and securing the micro-mechanical sensor chip to the second chip.

2. The method of claim 1, further comprising:
configuring the protective membrane at a reduced thickness.

3. The method of claim 1, wherein the protective membrane is configured using a chemical and mechanical planarization process.

4. The method of claim 1, wherein a thickness of the protective membrane is less than 10 microns.

5. The method of claim 1, further comprising:
configuring a sealing bond ring to surround the micro-mechanical sensor structure.

6. The method of claim 1, wherein the protective membrane includes an opening.

7. The method of claim 1, wherein the protective membrane is configured to be at least partially absent.

8. The method of claim 1, further comprising:
applying a bond between the micro-mechanical sensor chip and the second chip to secure the micro-mechanical sensor chip to the second chip.

9. The method of claim 1, wherein the embedded micro-mechanical sensor structure is sensitive to one of a pressure, an acceleration, a rotation, and a temperature.

10. The method of claim 1, wherein the second chip is at least one of an electronic integrated circuit chip and an actuator chip.

11. The method of claim 1, further comprising:
applying a bond between the micro-mechanical sensor chip and the second chip to secure the micro-mechanical sensor chip to the second chip;
arranging the micro-mechanical sensor chip and the second chip on a package frame to support the micro-mechanical sensor chip and the second chip in a single package; and
applying a plastic mold to seal the micro-mechanical sensor chip and the second chip in the single package.

12. The method of claim 11, wherein the protective membrane is configured using a chemical and mechanical planarization process.

13. The method of claim 11, wherein a thickness of the protective membrane is less than 10 microns.

14. The method of claim 1, further comprising:
configuring a sealing bond ring to surround the micro-mechanical sensor structure;
arranging the micro-mechanical sensor chip and the second chip on a package frame to support the micro-mechanical sensor chip and the second chip in a single package; and
applying a plastic mold to seal the micro-mechanical sensor chip and the second chip in the single package.

15. The method of claim 14, wherein the protective membrane includes an opening.

16. The method of claim 14, wherein the protective membrane is configured to be at least partially absent.

17. A method of protecting a micro-mechanical sensor structure embedded in a micro-mechanical sensor chip, comprising:

fabricating the micro-mechanical sensor structure with a protective membrane arranged on a face of the embedded micro-mechanical sensor structure;

arranging the micro-mechanical sensor chip directly onto a face of a second chip that faces, and is parallel to, the face of the embedded micro-mechanical sensor structure, so that the protective membrane is arranged between the faces;

arranging the micro-mechanical sensor chip and the second chip on a package frame to support the micro-mechanical sensor chip and the second chip in a single package; and applying a plastic mold to seal the micro-mechanical sensor chip and the second chip in the single package.

18. A method of protecting a micro-mechanical sensor structure embedded in a micro-mechanical sensor chip, comprising:

fabricating the micro-mechanical sensor structure with a protective membrane arranged on the embedded micro-mechanical sensor structure;

arranging the micro-mechanical sensor chip onto a second chip so that the protective membrane faces toward the first chip;

arranging at least one additional micro-mechanical sensor chip at least one of on, underneath, and between the micro-mechanical sensor chip and the second chip to provide a multi-sensor device.

19. The method of claim 18, wherein the multi-sensor device includes at least one of an accelerometer, a gyroscope, a temperature sensor, and a pressure sensor.

20. The method of claim 18, wherein the multi-sensor device includes at least one of a multi-dimensional accelerometer and a multi-dimensional gyroscope.

21. A micro-mechanical sensor device, comprising:
a first chip;
a micro-mechanical sensor chip having an embedded micro-mechanical sensor structure and a protective membrane arranged on a face of the embedded micro-mechanical sensor structure;
a package frame to support the first chip and the micro-mechanical sensor chip in a single package; and
a plastic mold to seal the first chip and the micro-mechanical sensor chip in the single package;
wherein the micro-mechanical sensor chip is arranged directly onto a face of the first chip that faces and is parallel to the face of the embedded micro-mechanical sensor structure so that the protective membrane is arranged between the faces.

22. The micro-mechanical sensor device of claim 21, wherein the protective membrane is configured at a reduced thickness.

23. The micro-mechanical sensor device of claim 21, wherein a thickness of the protective membrane is less than 10 microns.

24. The micro-mechanical sensor device of claim 21, further comprising:
a bond to secure the micro-mechanical sensor chip to the first chip.

25. The micro-mechanical sensor device of claim 21, further comprising:
a sealing bond ring to surround the embedded micro-mechanical structure.

26. The micro-mechanical sensor device of claim 21, wherein the protective membrane includes an opening.

27. The micro-mechanical sensor device of claim 21, wherein the protective membrane is at least partially absent.

28. The micro-mechanical sensor device of claim 21, wherein the embedded micro-mechanical sensor structure is sensitive to one of a pressure, acceleration, a rotation, and a temperature.

29. The micro-mechanical sensor device of claim 21, wherein the first chip is at least one of an electronic integrated circuit chip and an actuator chip.

30. A micro-mechanical sensor device, comprising:
a first chip;
a micro-mechanical sensor chip having an embedded micro-mechanical sensor structure and a protective membrane arranged on a face of the embedded micro-mechanical sensor structure;
an RF chip arranged on the micro-mechanical sensor chip for wireless communication;
wherein the micro-mechanical sensor chip is arranged directly onto a face of the first chip that faces and is parallel to the face of the embedded micro-mechanical sensor structure so that the protective membrane is arranged between the faces.

31. The micro-mechanical sensor device of claim 30, further comprising:
a substrate, wherein a difference in dielectric coefficient for the RF chip as an upper chip and an additional space between the upper RF chip and the substrate provided by the use of the micro-mechanical sensor chip as an intermediate chip provides an improved RF performance.

32. A micro-mechanical sensor device, comprising:
a first chip;
a micro-mechanical sensor chip having an embedded micro-mechanical sensor structure and a protective membrane arranged on a face of the embedded micro-mechanical sensor structure;
a bond to secure the micro-mechanical sensor chip to the first chip;
a package frame to support the first chip and the micro-mechanical sensor chip in a single package; and
a plastic mold to seal the first chip and the micro-mechanical sensor chip in the single package;
wherein:
the micro-mechanical sensor chip is arranged directly onto a face of the first chip that faces and is parallel to the face of the embedded micro-mechanical sensor structure so that the protective membrane is arranged between the faces; and
the protective membrane is configured at a reduced thickness.

33. The micro-mechanical sensor device of claim 32, wherein a thickness of the protective membrane is less than 10 microns.

34. A micro-mechanical sensor device, comprising:
a first chip;
a micro-mechanical sensor chip having an embedded micro-mechanical sensor structure and a protective membrane arranged on a face of the embedded micro-mechanical sensor structure;
a sealing bond ring to surround the embedded micro-mechanical structure;
a package frame to support the first chip and the micro-mechanical sensor chip in a single package; and
a plastic mold to seal the first chip and the micro-mechanical sensor chip in the single package;
wherein:
the micro-mechanical sensor chip is arranged directly onto a face of the first chip that faces and is parallel to the face of the embedded micro-mechanical sensor structure so that the protective membrane is arranged between the faces; and
the protective membrane is at least partially absent.

35. A Micro-mechanical sensor device, comprising:
a first chip; and
a micro-mechanical sensor chip having an embedded micro-mechanical sensor structure and a protective membrane arranged on the embedded micro-mechanical sensor structure,
wherein:
the micro-mechanical sensor chip is arranged directly onto the first chip so that the protective membrane faces toward the first chip; and
the protective membrane is arranged to directly cover the embedded micro-mechanical sensor structure.

36. The micro-mechanical sensor device of claim 35, wherein a thickness of the protective membrane is less than 10 microns.

37. The micro-mechanical sensor device of claim 35, further comprising:
a bond to secure the micro-mechanical sensor chip to the first chip.

38. The micro-mechanical sensor device of claim 35, further comprising:
a sealing bond ring to surround the embedded micro-mechanical structure.

39. The micro-mechanical sensor device of claim 35, wherein the protective membrane includes an opening.

40. A method of protecting a micro-mechanical sensor structure embedded in a micro-mechanical sensor chip, comprising:
fabricating the micro-mechanical sensor structure with a protective membrane arranged on a face of the embedded micro-mechanical sensor structure;
arranging an RF chip on the micro-mechanical sensor chip for wireless communication; and
arranging the micro-mechanical sensor chip directly onto a face of a second chip that faces, and is parallel to, the face of the embedded micro-mechanical sensor structure, so that the protective membrane is arranged between the faces.

* * * * *